(12) United States Patent
Fukui (10) Patent No.: US 7,439,637 B2
(45) Date of Patent: Oct. 21, 2008

(54) SEMICONDUCTOR CIRCUIT AND RESISTANCE VALUE CONTROLLING METHOD

(75) Inventor: Tadashi Fukui, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 285 days.

(21) Appl. No.: 11/480,432

(22) Filed: Jul. 5, 2006

(65) Prior Publication Data

US 2007/0018503 A1     Jan. 25, 2007

(30) Foreign Application Priority Data

Jul. 19, 2005   (JP) .............................. 2005-209063

(51) Int. Cl.
    *G01R 19/12*   (2006.01)
(52) U.S. Cl. .......................................... 307/152; 716/5
(58) Field of Classification Search .................. 307/152
    See application file for complete search history.

(56) References Cited

U.S. PATENT DOCUMENTS 6,571,376 B1 *   5/2003   Levin et al. ..................... 716/5

FOREIGN PATENT DOCUMENTS

| JP | 2-170570 | 7/1990 |
|----|----------|--------|
| JP | 2000-307410 | 11/2000 |
| JP | 2003-122465 | 4/2003 |

* cited by examiner

*Primary Examiner*—Robert L. Deberadinis
(74) *Attorney, Agent, or Firm*—McGinn IP Law Group, PLLC (57) ABSTRACT

A semiconductor circuit according to an embodiment of the invention includes: a terminal resistor circuit including a first Pch transistor; and a control circuit for outputting a control signal to a gate terminal of the first Pch transistor to control a resistance value of the terminal resistor circuit, the control circuit including: a second Pch transistor having a resistance value that is changed in the same direction as a resistance value of the second first transistor with respect to a specific parameter; and a resistor having a resistance value that is less changed than the resistance value of the second transistor with respect to the specific parameter, wherein the control circuit outputting the control signal based on a voltage between the second Pch transistor and the resistor.

18 Claims, 5 Drawing Sheets

SEMICONDUCTOR CIRCUIT AND RESISTANCE VALUE CONTROLLING METHOD

BACKGROUND OF THE INVENTION

1. Field of the Invention

The present invention relates to a semiconductor circuit and a resistance value controlling method. In particular, the invention relates to a semiconductor circuit having a resistor circuit including a transistor, and a resistance value controlling method used for the semiconductor circuit.

2. Description of Related Art

In recent years, an operation speed of a semiconductor integrated circuit has been increased. As the operational speed of the integrated circuit increases, an influence of a reflection signal as a reflected transmission signal becomes large. In order to suppress the reflection signal, a terminal resistor is provided to an input buffer circuit for impedance matching. Accordingly, it is desirable to use a high-accuracy terminal resistor.

However, a resistance value of the terminal resistor varies depending on use conditions or the like. For example, the resistance value of the terminal resistor varies in accordance with change in ambient temperature or applied power supply voltage, for example. Further, a resistance value fluctuates due to manufacturing process variations. If the resistance value of the terminal resistor is shifted from a predetermined value, impedance mismatching occurs.

To that end, a semiconductor circuit for correcting a resistance value of the terminal resistor is disclosed. For example, in an interface circuit as disclosed in Japanese Unexamined Patent Application Publication No. 2000-307410, control signals S1 and S2 from the terminal resistor control circuit are input to the terminal resistor composed of a transistor. Then, the control signals S1 and S2 are changed based on an external input signal INb to thereby control the resistance value of the terminal resistor. Further, a circuit as disclosed in Japanese Unexamined Patent Application Publication No. 2-170570 also outputs a control signal based on an external input signal to control a resistance value of the terminal resistor. Circuits as disclosed in Japanese Unexamined Patent Application Publication No. 2003-122465 also control a resistance value of the terminal resistor using a control signal from a correction circuit.

However, the above semiconductor circuits have a problem in that an external input signal is necessary for generating a control signal for controlling the terminal resistor. Further, in the circuit as disclosed in Japanese Unexamined Patent Application Publication No. 2003-122465, although an external input signal is unnecessary, a correction circuit and a detection circuit composed of plural resistive elements and transistors are necessary. This leads to overheads of the circuit and size.

SUMMARY OF THE INVENTION

A semiconductor circuit according to an embodiment of the invention includes: a resistor circuit including a first transistor; and a control circuit for outputting a control signal to a control terminal of the first transistor and controlling a resistance value of the resistor circuit, the control circuit including: a second transistor having a resistance value that is changed in the same direction as a resistance value of the first transistor with respect to a specific parameter; and a first resistor having a resistance value that is less changed than the resistance value of the second transistor with respect to the specific parameter, wherein the control circuit outputting the control signal based on a voltage between the second transistor and the first resistor. Hence, the resistance value of the second transistor is changed in accordance with the change in resistance value of the first transistor. Accordingly, a voltage level of the control signal input to a control terminal of the first transistor is changed so as to suppress the variations in resistance value. Thus, the variations in resistance value of the resistor circuit can be suppressed.

According to another aspect of the invention, a resistance value controlling method for controlling a resistance value of a resistor circuit including a first transistor, includes: connecting a gate of the first transistor with a control circuit including a second transistor having a resistance value that is changed in the same direction as a resistance value of the first transistor and controlling a control voltage based on the change of the resistance value of the second transistor; and controlling a bias voltage applied to the gate of the first transistor using the control voltage to control an on-resistance value of the first transistor. Hence, the resistance value of the second transistor is changed in accordance with the change in resistance value of the first transistor. Accordingly, a voltage level of the control signal input to a control terminal of the first transistor is changed so as to suppress the variations in resistance value. Thus, the variations in resistance value of the resistor circuit can be suppressed.

According to the present invention, it is possible to provide a semiconductor circuit and a resistance value controlling method which can suppress variations in resistance value.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of the present invention are described. The following description is given for demonstrating the embodiments of the present invention, and the present invention should not be construed as limited to the following embodiments. For ease of illustration, the following description is omitted or simplified as necessary. In addition, those skilled in the art would readily change or replace components of the following embodiments or add another component thereto, within the scope of the present invention. Throughout the accompanying drawings, the same components are denoted by like reference numerals and their description is omitted if not necessary.

First Embodiment

Figure 1:
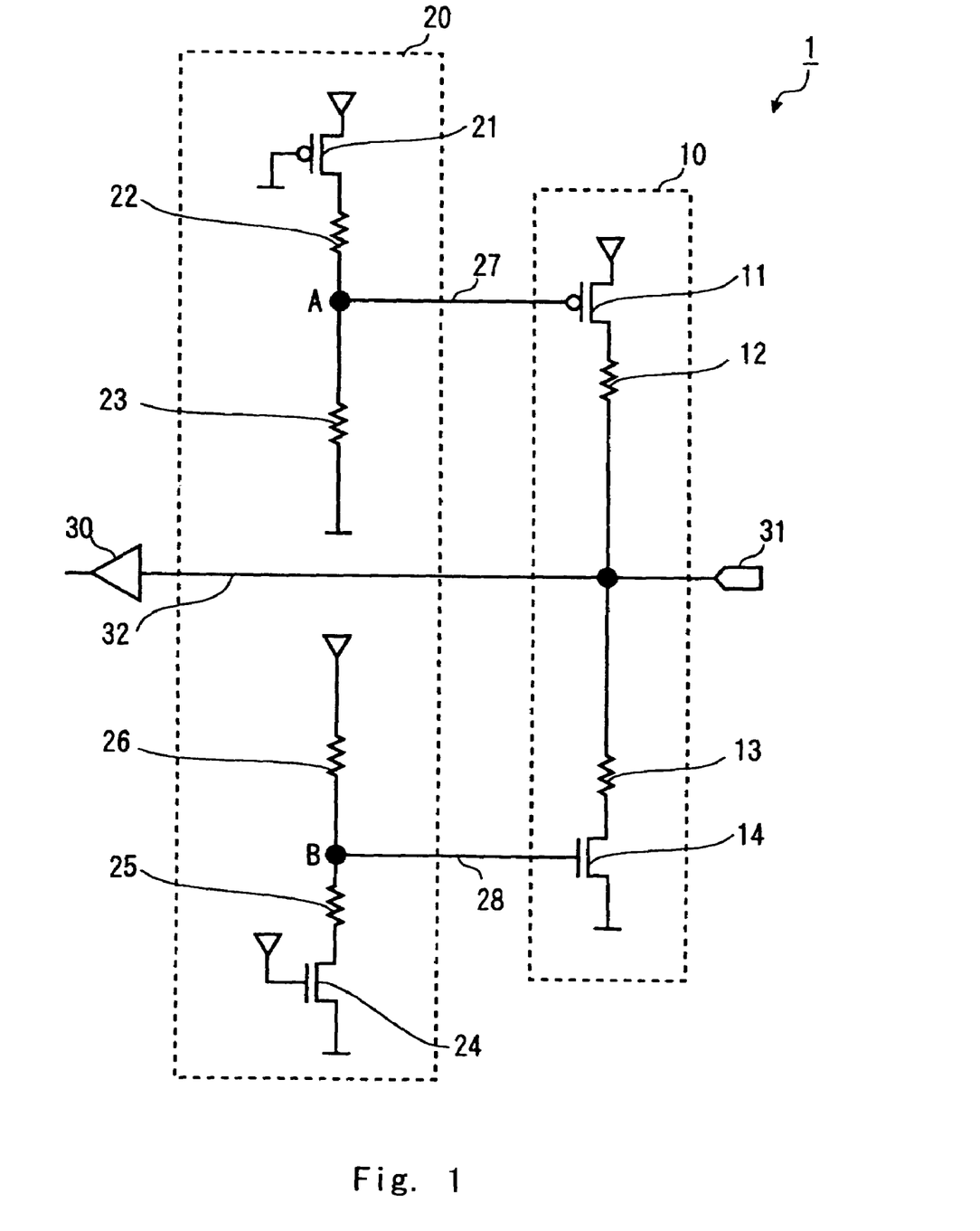
FIG. 1 shows the configuration of a semiconductor circuit according to a first embodiment of the present invention.

Referring to FIG. 1, the configuration of a semiconductor circuit according to a first embodiment of the present invention is described. FIG. 1 shows the circuit configuration of the semiconductor circuit of this embodiment. In this embodiment, a semiconductor circuit 1 is assumed as an input buffer circuit incorporated in the interface circuit. That is, the semiconductor circuit 1 functions as the input buffer circuit in the interface circuit. The semiconductor circuit 1 includes a terminal resistor circuit 10, a control circuit 20, and an input buffer 30. The external input signal is input to an input terminal 31. Then, the signal input to the input terminal 31 is supplied to the input buffer 30 through a line 32. The input buffer 30 outputs the input signal to an internal circuit. In this way, the external input signal is transmitted to the internal circuit of a semiconductor chip by way of the semiconductor circuit 1 as the input buffer circuit.

The terminal resistor circuit 10 includes a Pch transistor 11, a resistive element 12, a resistive element 13, and an Nch transistor 14. The Pch transistor 11, the resistive element 12, the resistive element 13, and the Nch transistor 14 are series-connected between the power supply voltage (VDD) and the ground (GND). A source terminal of the Pch transistor 11 is connected to the power supply voltage side, and a drain terminal thereof is connected with one end of the resistive element 12. A source terminal of the Nch transistor 14 is connected to the ground potential side, and a drain terminal thereof is connected with the resistive element 13. The resistive element 12 and the resistive element 13 are connected between the Pch transistor 11 and the Nch transistor 14. The terminal resistor circuit 10 is connected with the line 32 between the resistive element 12 and the resistive element 13.

It is preferable that the resistive element 12 and the resistive element 13 be high-accuracy resistive elements the resistance value of which is not so changed with respect to a change in temperature or power supply voltage. The line 32 between the input terminal 31 and the input buffer 30 is connected between the resistive element 12 and the resistive element 13. This enables impedance matching and suppresses reflection of an input signal. That is, impedance matching is attained by setting a resistance value of the terminal resistor of the terminal resistor circuit 10 to a predetermined value. The resistance value of the terminal resistor of the terminal resistor circuit 10 varies in accordance with change in an on-resistance of the Pch transistor 11, a resistance value of the resistive element 12, a resistance value of the resistive element 13, and an on-resistance of the Nch transistor 14.

A control signal 27 is input from the control circuit 20 to a gate terminal of the Pch transistor 11, and a control signal 28 is input to a gate terminal of the Nch transistor 14 from the control circuit 20. In response to the control signal 27, a resistance of the Pch transistor 11 is controlled. In response to the control signal 28, a resistance of the Nch transistor 14 is controlled. The control signals 27 and 28 suppress variations in resistance value of the terminal resistor that results from the change in ambient temperature or power supply voltage (VDD). That is, even if the ambient temperature or power supply voltage (VDD) varies depending on the usage conditions, it is possible to suppress a change in resistance value of the terminal resistor of the terminal resistor circuit 10 using the control signals 27 and 28 from the control circuit 20. Further, even if a resistance value of a transistor differs from a target reference value due to the manufacturing process variation, the change in resistance value of the terminal resistor due to the difference can be suppressed.

Here, the configuration of the control circuit 20 for controlling a resistance value of the terminal resistor of the terminal resistor circuit 10 is described. The control circuit 20 includes a Pch transistor 21, a resistive element 22, a resistor 23, an Nch transistor 24, a resistive element 25, and an element 26. To begin with, the configuration for outputting the control signal 27 in the control circuit 20 is described. As shown in FIG. 1, a source terminal of the Pch transistor 21 is connected with the power supply voltage, and its drain terminal is connected with the resistive element 22. The resistor 23 has one end connected with the resistive element 22 and the other end grounded. The voltage level of the control signal 27 depends on a voltage (potential) across the resistive element 22 and the resistor 23, that is, a bias voltage at a point A. Incidentally, in FIG. 1, the terminal resistor circuit 10 and the control circuit 20 are composed of circuit elements connected with the power supply side (the Pch transistor 11, the resistive element 12, the Pch transistor 21, and the resistor 23) and circuit elements connected with the ground side (Nch transistor 14, resistive element 13, Nch transistor 24, element 26) but may be composed of only circuit elements connected with either the power supply side or the ground side.

The bias voltage of the point A varies depending on a resistance value ratio between the Pch transistor 21 and the resistive element 22, and the resistor 23. That is, if the power supply voltage is fixed, the bias voltage of the point A varies depending on (resistance value of the resistor 23)/(resistance value of the Pch transistor 21+resistance value of the resistive element 22+resistance value of the resistor 23). For example, under the condition that the resistance value of the resistor 23 is fixed, if the total resistance value of the Pch transistor 21 and the resistive element 22 increases, the bias voltage of the point A is lowered. Further, under the condition that the resistance value of the resistor 23 is fixed, if the total resistance value of the Pch transistor 21 and the resistive element 22 decreases, the bias voltage of the point A is increased. As a result, the voltage level of the control signal 27 can be controlled.

Next, the configuration for suppressing variations in resistance value of the terminal resistor circuit 10 which result from the temperature change is described. That is, the resistive element and the transistor used in the integrated circuit generally increase the resistance value as the temperature rises. However, the control signal 27 is input from the control circuit 20 configured as shown in FIG. 1 into the terminal resistor circuit 10, thereby making it possible to suppress variations in resistance value of the terminal resistor circuit 10 which result from the temperature change. Hereinafter, the configurations of the Pch transistor 21, the resistive element 22, and the resistor 23 of the control circuit 20, and the Pch transistor 11 and the resistive element 12 of the terminal resistor circuit 10 are described.

It is assumed that that a resistance value of the resistor 23 is less changed than the resistance values of the Pch transistor 21 and the resistive element 22 due to the manufacturing process variation and the temperature change. That is, even if the temperature is changed, the resistance value of the resistor 23 is less changed than the resistance values of the Pch transistor 21 and the resistive element 22. For example, when the temperature increases, the resistance values of the Pch transistor 21, the resistive element 22, and the resistor 23 increase.

However, the degree of change in resistance value of the resistor 23 due to the temperature change is smaller than that of the resistance value of the Pch transistor 21 and the resistive element 22. Therefore, a value of (resistance value of the resistor 23)/(resistance value of the Pch transistor 21+resistance value of the resistive element 22+resistance value of the resistor 23) is decreased in accordance with the temperature rise, and the bias voltage of the point A is lowered. As a result, the voltage level of the control signal 27 is lowered, and the voltage of the gate terminal of the Pch transistor 11 is decreased. Accordingly, the on-resistance value of the Pch transistor 11 is reduced to cancel the increase in resistance value resulting from the temperature rise. Thus, the variations in resistance value of the terminal resistor circuit 10 can be suppressed.

Likewise, as for the Nch transistor 24, the resistive element 25, and the element 26, the change in resistance value of the element 26 due to the temperature change is suppressed. As a result, if the temperature increases, the bias voltage of the point B is increased. Thus, the voltage level of the control signal 28 is increased, and the voltage of the gate terminal of the Nch transistor 14 becomes higher. As a result, the on-resistance value of the Nch transistor 14 is lowered, and the variations in resistance value of the terminal resistor circuit 10 can be suppressed. In this way, the increase in resistance value of the terminal resistor circuit 10 due to the temperature rise is suppressed using the control signals 27 and 28. At this time, the voltage level of the control signals 27 and 28 is controlled in accordance with the change in resistance value resulting from the temperature rise of each element of the control circuit 20. Accordingly, during the operation of the semiconductor circuit 1, the bias voltages of the points A and B is changed only by supplying the power supply voltage, so the voltage level of the control signals 27 and 28 can be easily controlled. Thus, it is unnecessary to externally input a control signal or provide a complicated control circuit unlike the conventional technique, so the variations in resistance value of the terminal resistor can be suppressed.

Figure 2:
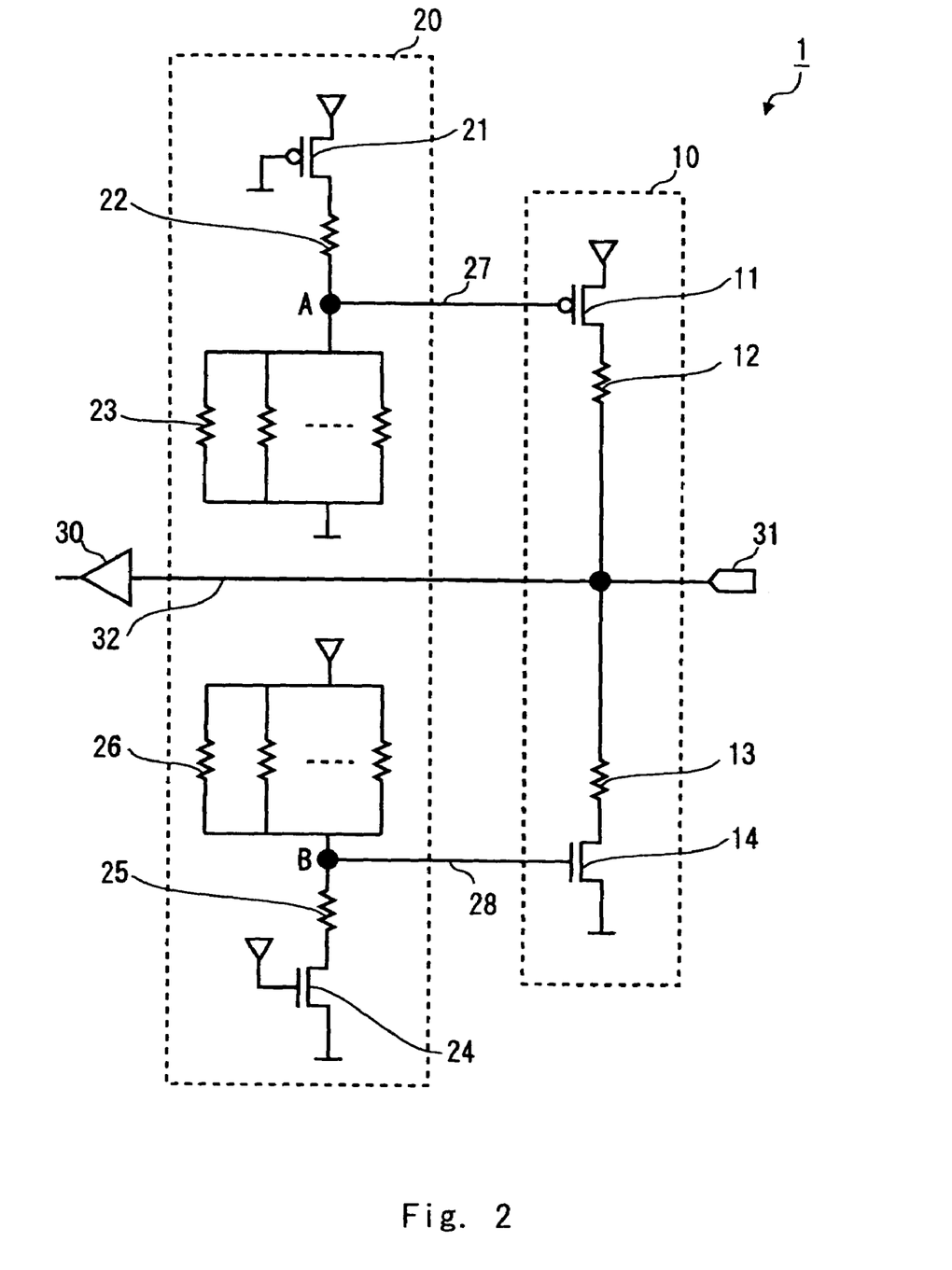
FIG. 2 shows another configuration of the semiconductor circuit of the first embodiment.

In this way, the control circuit 20 is provided with the resistor 23 the resistance value of which is less changed than the Pch transistor 21 and the resistive element 22, whereby the variations in resistance value of the terminal resistor circuit 10 due to the temperature rise can be suppressed. Incidentally, if the resistor 23 is set wider than the resistive element 22, for example, the variations in resistance value with respect to the manufacturing process variation can be suppressed. Alternatively, as shown in FIG. 2, if the resistor 23 is a parallel-resistance, the degree of change in resistance value of each resistor can be reduced, so the variations of the total resistance value can be suppressed. Further, if the resistor 23 is composed of parallel-connected resistive elements, the degree of change in resistance value of each of the parallel-connected resistive elements can be equivalent to the resistive element 22.

Incidentally, the above description is focused on the temperature increase, but the variations in resistance value of the terminal resistor can be also suppressed even if the temperature decreases. That is, when the temperature decreases, the resistance value of each element is lowered, so the bias voltage of the point A increases. Thus, the voltage level of the control signal 27 increases, and the voltage of the gate terminal of the Pch transistor 11 becomes higher. Accordingly, the on-resistance of the Pch transistor 11 is increased, and variations in resistance value can be suppressed. Further, when the temperature decreases, the bias voltage of the point B is lowered, and the resistance value of the Nch transistor 14 is increased. Accordingly, the variations in resistance value can be suppressed. In this way, even if the temperature is changed in accordance with the usage condition, the variations in resistance value of the terminal resistor can be suppressed.

Moreover, according to the present invention, the variations in resistance value of the terminal resistor due to a change in power supply voltage can be also suppressed. That is, if the power supply voltage is higher, the resistance value of the resistive element increases, and the resistance value of the transistor decreases. Accordingly, if the control circuit 20 is composed of elements the resistance value of which is changed due to the change in power supply voltage in the same direction as the change in resistance value of the resistor of the terminal resistor circuit 10 (both increased and decreased), the variations in resistance value of the terminal resistor due to the change in power supply voltage can be readily suppressed. Thus, even if the power supply voltage is changed, the variations in the resistance value of the terminal resistor can be suppressed.

Further, if a resistance value of the elements of the control circuit 20 is changed with respect to the manufacturing process variation in the same direction as the change of the elements of the terminal resistor circuit 10, the variations in resistance value of the terminal resistor due to the manufacturing process variation can be suppressed. For example, a gate electrode is made of polysilicon, the gate length varies depending on the density of polysilicon. Accordingly, the polysilicon density of the Pch transistor 21 is set to change in the same direction as the change in polysilicon density of the Pch transistor 11 due to the manufacturing process variations. That is, if the polysilicon density of the Pch transistor 11 exceeds a design value due to the manufacturing process variations, the polysilicon density of the Pch transistor 21 is also set higher than the design value. Further, if the polysilicon density of the Pch transistor 11 is lower than the design value due to the manufacturing process variations, the polysilicon density of the Pch transistor 21 is also set lower than the design value. Thus, the bias voltage of the point A is changed, so the variations in resistance value of the terminal resistor due to the manufacturing process variation can be suppressed.

Further, a resistance value of the resistive element 22 is also changed in the same direction as the resistance value of the resistive element 12. That is, the width and thickness of the resistive element 22 are changed due to the manufacturing process variations in the same direction as the change of the width and thickness of the resistive element 12. Thus, a difference of the resistance value of the terminal resistor from the design value which results from the manufacturing process variations can be minimized. That is, even if the resistance of the resistive element 12 or the Pch transistor 11 is changed between the semiconductor circuits due to the manufacturing process variations, the variations in resistance value of the terminal resistor can be suppressed. Incidentally, the above description is focused on the pull-up resistor (resistive element 12). However, the same applies to the pull-down resistor (resistive element 13).

As described above, in case that the resistance value of the elements of the terminal resistor circuit 10 is changed in accordance with the change in the specific parameter (temperature, power supply voltage, manufacturing process variations, or the like), elements the resistance value of which is changed in accordance with the change in a specific parameter in the same direction as the elements of the terminal resistor circuit 10 are provided in the control circuit 20. In addition, the control circuit 20 is composed of elements resistance value of which is less changed due to a predetermined parameter than the elements the resistance value of which is changed due to the predetermined parameter in the same direction as the resistive elements of the terminal resistor circuit 10. As a result, the variations in resistance value of the terminal resistor can be suppressed. That is, the semiconductor device may be designed and manufactured such that when a given parameter is changed, the resistance value of the elements of the terminal resistor circuit 10 is changed in the same direction as the resistance value of the elements of the control circuit 20. In this way, a gate terminal of a first transistor provided in the resistor circuit 10 is connected with the control circuit 20 having a second transistor the resistance value of which is changed in the same direction as the resistance value of the first transistor. Then, a control voltage of the control circuit 10 is used to control the bias voltage applied to the gate terminal of the first transistor. In this way, the variations in resistance value of the resistor circuit 10 can be suppressed under the control.

The elements of the control circuit 20 are preferably the same type as the elements of the terminal resistor circuit 10. That is, the element configuration from the power supply voltage to the point A in the control circuit 20 is designed to be similar to the element configuration from the power supply voltage to the line 32 in the terminal resistor circuit 10. In addition, the element configuration from the ground to point B in the control circuit 20 is designed to be similar to the element configuration from the ground to the line 32 in the terminal resistor circuit 10. As a result, even if a particular parameter such as the temperature or the power supply voltage is changed in accordance with the usage condition, the resistance value is changed in the same direction as the change of the parameter. Thus, the variations in resistance value of the terminal resistor can be readily suppressed.

Figure 3:
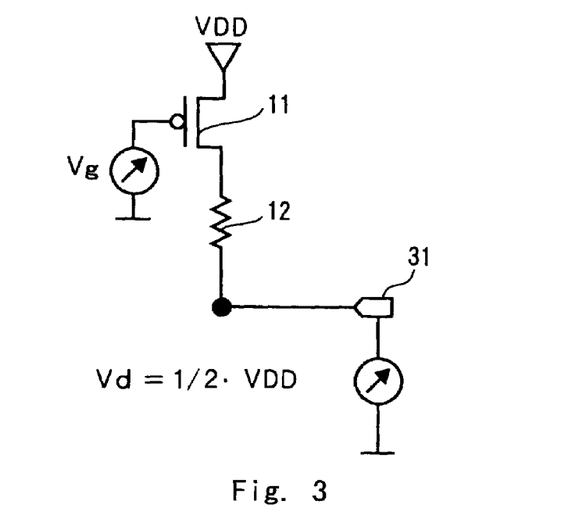
FIG. 3 shows the circuit configuration used for simulating a change in resistance value of a terminal resistor circuit in the semiconductor circuit of the first embodiment.

Referring next to FIG. 3, description is give of how the resistance value of the terminal resistor is changed when the bias voltage of the point A is changed. FIG. 3 schematically shows a part of the pull-up side in the terminal resistor circuit 10 of FIG. 1. The following description is focused on the pull-up side of the terminal resistor circuit 10. With the configuration of FIG. 3, a resistance value of the terminal resistor is calculated in simulation under the condition that the gate voltage of the Pch transistor 11 is changed.

As shown in FIG. 3, the power supply voltage of the terminal resistor circuit 10 is referred to as "VDD", and the voltage Vd of the input terminal 31 is set to "½ VDD". Further, a target resistance value of the terminal resistor is 300 Ω during the simulation. In addition, the gate voltage of the Pch transistor 11, that is, a voltage corresponding to the bias voltage of the point A is referred to as "Vg". This voltage Vg corresponds to the control signal 27 of FIG. 1.

For example, if the gate voltage Vg of the Pch transistor 11 is fixed at 0 V without control, a resistance value of the Pch transistor 11 is 177.43 to 260.43Ω (±18.9Ω), and a resistance value of the resistive element 12 is 65.22 to 98.53Ω (±20.2%). At this time, the total resistance value of the terminal resistor is 242.65 to 358.95Ω (±19.3%).

On the other hand, the voltage Vg is controlled to range from 0.5 to 1.24 V, the resistance value of the Pch transistor 11 is 170.20 to 249.80Ω (±18.9%), and the resistance value of the resistive element 12 is 83.27 to 99.56Ω (±8.9%). At this time, the total resistance value of the terminal resistor is 253.47 to 349.36Ω (±15.9%). As described above, the gate voltage Vg, that is, the bias voltage of the point A is controlled, making it possible to suppress the variations in resistance value of the terminal resistor.

Figure 4:
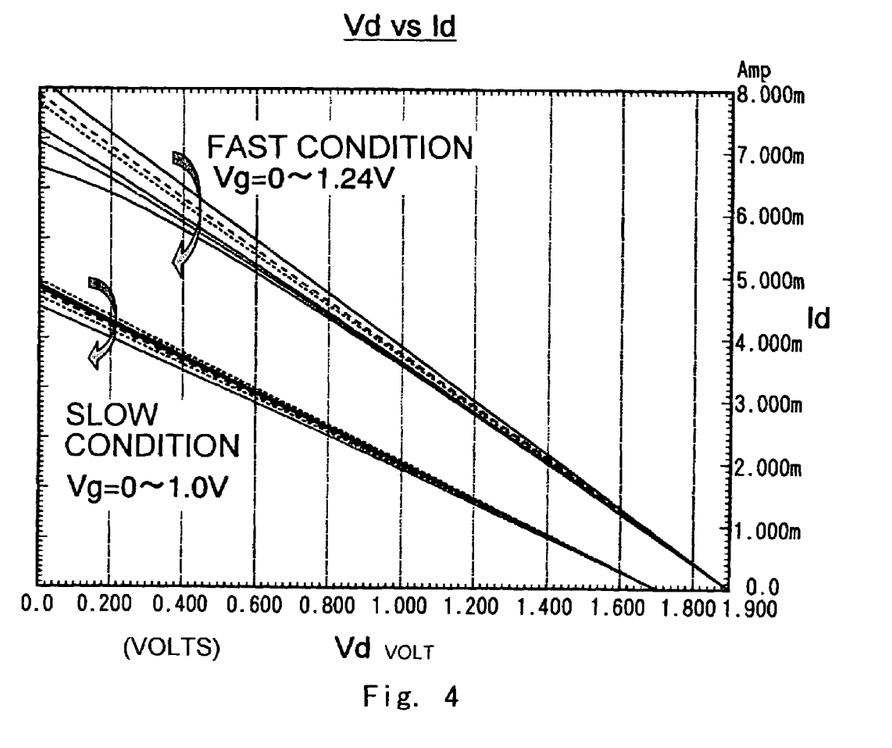
FIG. 4 shows a result of simulating the change in resistance value of the terminal resistor circuit in the semiconductor circuit of the first embodiment.

Next, FIG. 4 shows a result of simulating a relation between the voltage Vd of the input terminal 31 and the current Id flowing through the terminal resistor circuit 10.

FIG. 4 shows the simulation result with the configuration of FIG. 3. In this example, the change of the current Id is illustrated under the condition that the voltage VDD is fixed and the voltage Vd is changed. That is, a voltage applied to a series circuit of the Pch transistor 11 and the resistive element 12 is (VDD−Vd). Accordingly, when the voltage Vd becomes higher, the voltage applied to the series circuit of the Pch transistor 11 and the resistive element 12 is lowered.

The Fast condition of FIG. 4 is a high power supply voltage and low temperature, and the Slow condition of FIG. 4 is a low power supply voltage and high temperature. Under the Fast condition, the power supply voltage is high, so the driving power of the Pch transistor 11 increases. In addition, since the temperature is low, the resistance value of the resistive element 12 is lowered. Accordingly, the impedance of the terminal resistor circuit 10 is reduced, and an amount of current is increased. On the other hand, under the Slow condition, the power supply voltage is low, so the driving power of the Pch transistor 11 is reduced. Further, since the temperature is high, a resistance value of the resistive element 12 increases. Accordingly, the impedance of the terminal resistor circuit 10 increases, and an amount of the current Id is decreased. Hence, provided that the voltage Vd is fixed, the amount of the current Id under the Fast condition is larger than the amount of the current Id under the Slow condition. In this way, the relation between the voltage Vd and the current Id is plotted to two groups (under the Fast condition and the Slow condition). Then, the upper plot group is the simulation result under the Fast condition, and the lower plot group is the simulation result under the Slow condition.

In the Fast condition, the simulation is performed with the voltage Vg of 0 to 1.24 V. In the Slow condition, the simulation is performed with the voltage Vg of 0 to 1.0 V. For example, the relation between the voltage Vd and the current Id is plotted at 6 levels of the voltage Vg under both the Fast condition and the Slow condition in simulation. That is, FIG. 4 includes 6 plots under the Fast condition and 6 plots under the Slow condition. Incidentally, the gradient of the plot of FIG. 4 corresponds to a resistance value (impedance) of the pull-up resistor of the terminal resistor circuit 10 with respect to a specific level of voltage Vg.

Here, if the voltage Vg is low, a resistance value of the Pch transistor 11 is decreased. Thus, if the voltage Vg becomes low, an amount of current Id increases. Accordingly, the upper plot of FIG. 4 shows the simulation result at the voltage Vg=0 under both of the Fast condition and the Slow condition. On the other hand, the lowest plot of FIG. 4 shows the simulation result at the voltage Vg=1.24 V in the Fast condition, and the lowest plot of FIG. 4 shows the simulation result at the voltage Vg=1.0 in the Slow condition.

Here, if the same voltage Vg is used in the Fast condition and the Slow condition, the degree of gradient of the plot largely differs between the Fast condition and the Slow condition. For example, provided that the voltage Vg=0, the degree of gradient of the plot largely differs between the top plot in the Fast condition and the top plot in the Slow condition. That is, the impedance largely differs between the Fast condition and the Slow condition, resulting in impedance mismatching. However, if the voltage Vg is different between the Fast condition and the Slow condition, the degree of gradient does not largely differ therebetween. That is, the voltage Vg is controlled, whereby the impedance in the Fast condition can approximate the impedance in the Slow condition. For example, if the voltage Vg=1.24 V under the Fast condition, and the voltage Vg=0.5 V under the Slow condition, the difference in gradient is minimized. Thus, the impedance (resistance value of the terminal resistor) can be reduced.

As apparent from the simulation result, the voltage Vg is controlled, making it possible to suppress the variations in resistance value of the terminal resistor. Thus, the control circuit 20 of FIG. 1 controls the gate voltage Vg to suppress the variations in resistance value of the terminal resistor.

Second Embodiment

Figure 5:
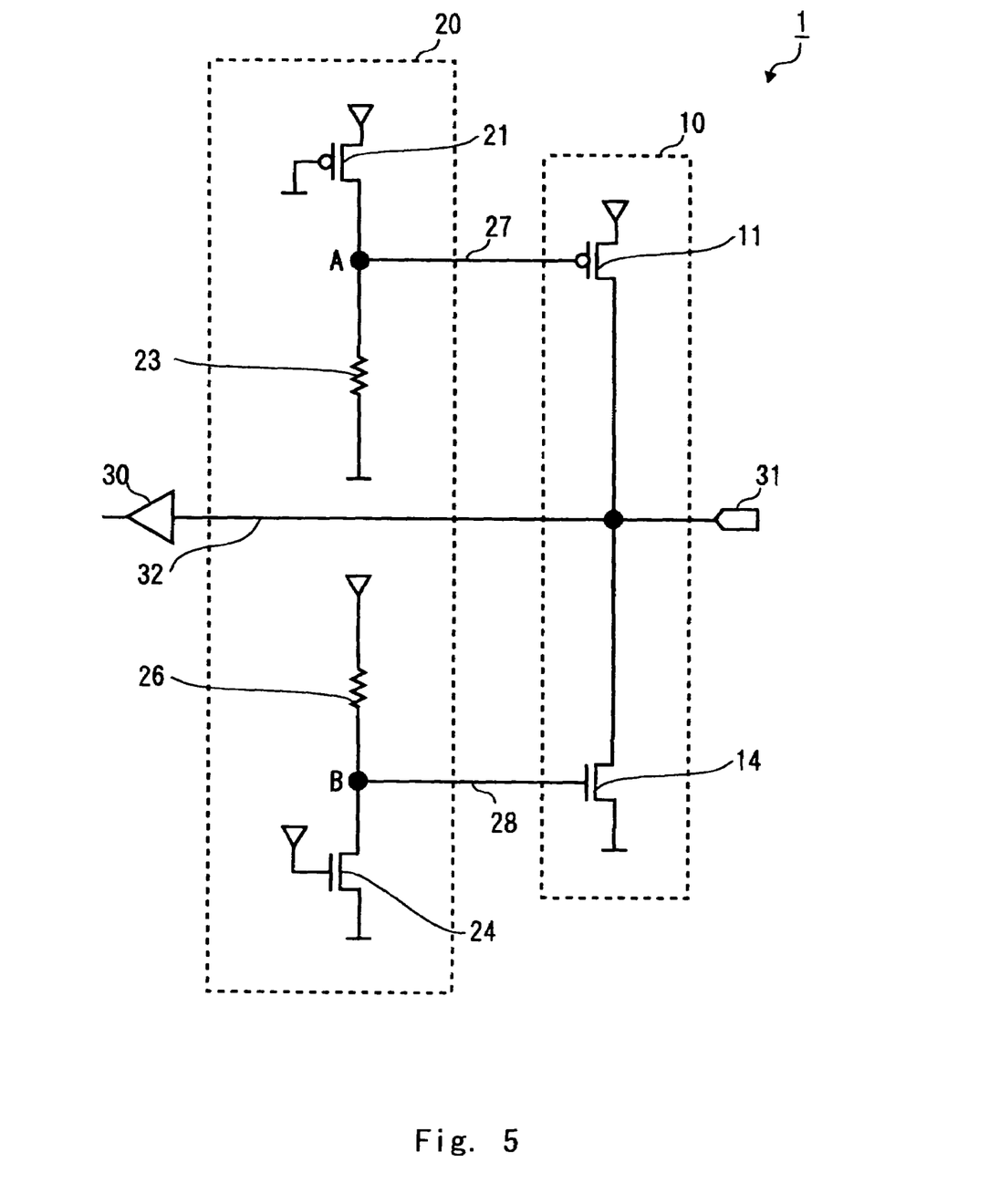
FIG. 5 shows the configuration of an interface circuit according to a second embodiment of the present invention.

Referring to FIG. 5, the semiconductor circuit 1 according to a second embodiment of the present invention is described. FIG. 5 shows the circuit configuration of the semiconductor circuit 1 of this embodiment. In this embodiment, similar to the first embodiment, the semiconductor circuit 1 is defined as the input buffer circuit. Further, description about the same components as those of the first embodiment is omitted here.

As shown in FIG. 5, in this embodiment, the terminal resistor circuit 10 is not provided with the resistive element 12 and the resistive element 13. That is, the Pch transistor 11 and the Nch transistor 14 are used as the terminal resistor. To be specific, a drain terminal of the Pch transistor 11 is connected with a drain terminal of the Nch transistor 14. The line 32 connecting between the input terminal 31 and the input buffer 30 is connected between the Pch transistor 11 and the Nch transistor 14. That is, drain terminals of the Pch transistor 11 and the Nch transistor 14 are connected to the line 32. Thus, the resistance value of the terminal resistor of the terminal resistor circuit 10 depends on the resistance of the Pch transistor 11 and the Nch transistor 14.

The control circuit 20 has neither the resistive element 22 nor the resistive element 25. That is, the configuration of the control circuit 20 from the power supply voltage to the point A is the same as the pull-up side of the terminal resistor circuit 10. Further, the configuration of the control circuit 20 from the point B to the ground is the same as the pull-down side of the terminal resistor circuit 10. Thus, if the resistance value of the Pch transistor 11 is changed, the bias voltage of the point A changes, so the variations in resistance value of the terminal resistor can be suppressed. In addition, if the resistance value of the Nch transistor 14 is changed, the bias voltage of the point B changes, so the variations in resistance value of the terminal resistor can be suppressed. Thus, the variations in resistance value of the terminal resistor of the terminal resistor circuit 10 can be suppressed. Consequently, the same beneficial effects as the first embodiment can be attained with the simple configuration.

Incidentally, in FIG. 5, the terminal resistor circuit 10 and the control circuit 20 are composed of the circuit elements on the power supply side (Pch transistor 11, resistive element 12, Pch transistor 21, and resistor 23) and the circuit elements on the ground side (Nch transistor 14, resistive element 13, Nch transistor 24, and element 26), but may be each composed of either the circuit elements on the power supply side or the circuit elements on the ground side. Needless to say, as shown in FIG. 2, the resistor 23 and the element 26 are connected in parallel as a parallel resistance.

Third Embodiment

Figure 6:
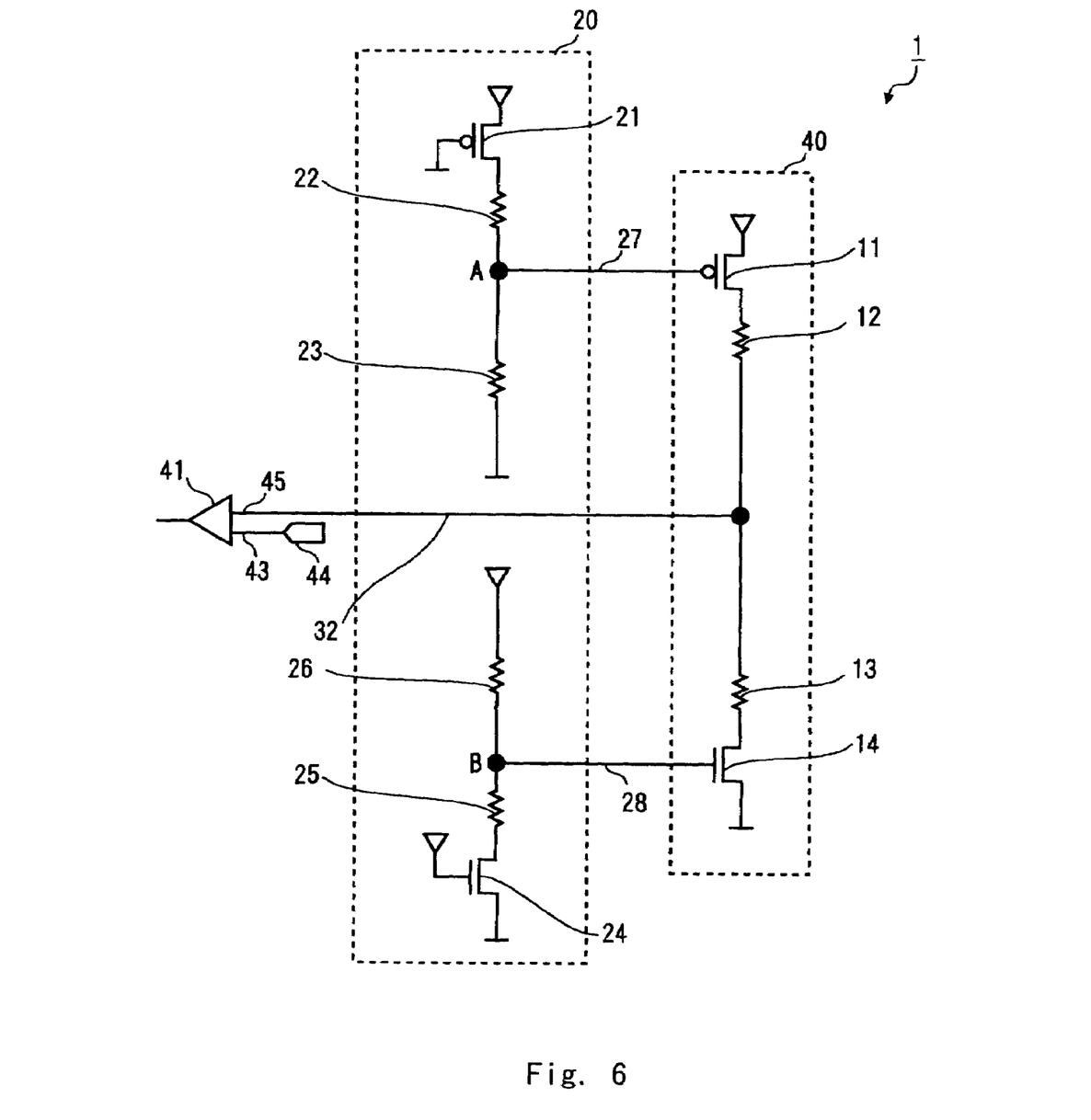
FIG. 6 shows the configuration of a semiconductor circuit according to a third embodiment of the present invention.

Referring to FIG. 6, the semiconductor circuit 1 according to a third embodiment of the invention is described. FIG. 6 is a circuit diagram showing the configuration of the semiconductor circuit of this embodiment. The semiconductor circuit 1 of this embodiment is a comparison circuit 41 and a circuit for inputting a reference signal 45 to the comparison circuit 41, not the input buffer circuit. That is, the circuit controls a resistance value of a resistor circuit 40 for generating the reference signal 45 to be input to the comparison circuit 41, not the terminal resistor circuit 10. In other words, the variations in resistance value of the resistor circuit 40 for generating the reference signal 45 are suppressed using the control circuit 20 of FIG. 1. Thus, the variations in resistance value are suppressed, making it possible to minimize the change in reference signal 45.

As shown in FIG. 6, the resistor circuit 40 for generating the reference signal 45 has the same configuration as the terminal resistor circuit 10 of the first embodiment. That is, the circuit includes the Pch transistor 11, the resistive element 12, the resistive element 13, and the Nch transistor 14. Then, a voltage (potential difference) between the resistive element 12 and the resistive element 13 corresponds to the reference signal 45, and the reference signal 45 is input to the comparison circuit 41. The comparison circuit 41 compares the comparison signal 43 input from the input terminal 44 to the comparison circuit 41 with the reference signal 45 and outputs a comparison result. As described in the first embodiment, the variations in resistance value of the resistor circuit 40 can be suppressed, so the change in reference signal 45 can be minimized. Accordingly, the comparison circuit 41 can stably output the comparison result irrespective of the usage conditions. Moreover, the variations in resistance value of the resistor circuit 40 due to the manufacturing process variation can be suppressed, and thus the comparison result can be stably output.

Incidentally, in FIG. 6, the terminal resistor circuit 10 and the control circuit 20 are composed of circuit elements on the power supply side (Pch transistor 11, resistive element 12, Pch transistor 21, and resistor 23) and circuit elements on the ground side (Nch transistor 14, resistive element 13, Nch transistor 24, and element 26) but may be each composed of either the circuit elements on the power supply side or the circuit elements on the ground side. Needless to say, as shown in FIG. 2, the resistor 23 and the element 26 may be arranged in parallel as a parallel resistance.

It is apparent that the present invention is not limited to the above embodiment that may be modified and changed without departing from the scope and spirit of the invention.

What is claimed is:

1. A semiconductor circuit, comprising:
   a resistor circuit including a first transistor; and
   a control circuit for outputting a control signal to a control terminal of the first transistor and controlling a resistance value of the resistor circuit,
   the control circuit comprising:
   a second transistor having a resistance value that is changed in the same direction as a resistance value of the first transistor with respect to a specific parameter; and
   a first resistor having a resistance value that is less changed than the resistance value of the second transistor with respect to the specific parameter,
   wherein the control circuit outputting the control signal based on a voltage between the second transistor and the first resistor.

2. The semiconductor circuit according to claim 1, wherein the resistor circuit further includes a second resistor,
   a third resistor is provided between the second transistor and the first resistor, and the control signal is output based on the voltage between the first resistor and the third resistor, and
   a resistance value of the third resistor is changed in the same direction as a change in the resistance value of the second resistor with respect to the specific parameter.

3. The semiconductor circuit according to claim 2, wherein the resistance value of the second transistor is changed in the same direction as a change in the resistance value of the first transistor with respect to manufacturing process variations.

4. The semiconductor circuit according to claim 3, wherein the first resistor is composed of a plurality of resistive elements that are arranged in parallel as a parallel resistance.

5. The semiconductor circuit according to claim 3, wherein the resistor circuit is a terminal resistor circuit provided to the input buffer circuit.

6. The semiconductor circuit according to claim 3, further comprising a comparison circuit applied with a reference voltage based on the resistance value of the resistor circuit.

7. The semiconductor circuit according to claim 2, wherein the first resistor is composed of a plurality of resistive elements that are arranged in parallel as a parallel resistance.

8. The semiconductor circuit according to claim 2, wherein the resistor circuit is a terminal resistor circuit provided to the input buffer circuit.

9. The semiconductor circuit according to claim 2, further comprising a comparison circuit applied with a reference voltage based on the resistance value of the resistor circuit.

10. The semiconductor circuit according to claim 1, wherein the resistance value of the second transistor is changed in the same direction as a change in the resistance value of the first transistor with respect to manufacturing process variations.

11. The semiconductor circuit according to claim 10, wherein the resistor circuit is a terminal resistor circuit provided to the input buffer circuit.

12. The semiconductor circuit according to claim 10, wherein the first resistor is composed of a plurality of resistive elements that are arranged in parallel as a parallel resistance.

13. The semiconductor circuit according to claim 10, further comprising a comparison circuit applied with a reference voltage based on the resistance value of the resistor circuit.

14. The semiconductor circuit according to claim 1, wherein the first resistor is composed of a plurality of resistive elements that are arranged in parallel as a parallel resistance.

15. The semiconductor circuit according to claim 1, wherein the resistor circuit is a terminal resistor circuit provided to the input buffer circuit.

16. The semiconductor circuit according to claim 1, further comprising a comparison circuit applied with a reference voltage based on the resistance value of the resistor circuit.

17. A resistance value controlling method for controlling a resistance value of a resistor circuit including a first transistor, comprising:
   connecting a gate of the first transistor with a control circuit including a second transistor having a resistance value that is changed in the same direction as a resistance value of the first transistor and controlling a control voltage based on the change of the resistance value of the second transistor; and
   controlling a bias voltage applied to the gate of the first transistor using the control voltage to control an on-resistance value of the first transistor.

18. The resistance value controlling method according to claim 17, wherein the resistor circuit is a terminal resistor circuit.

* * * * *